United States Patent
Chen et al.

(10) Patent No.: US 11,996,464 B2
(45) Date of Patent: May 28, 2024

(54) METHOD OF FABRICATING DIODE STRUCTURE

(71) Applicants: Jiangsu Advanced Memory Technology Co., Ltd., Jiangsu (CN); Jiangsu Advanced Memory Semiconductor Co., Ltd., Jiangsu (CN)

(72) Inventors: Chieh-Fang Chen, Hsinchu County (TW); Kuo-Feng Lo, Hsinchu County (TW); Chung-Hon Lam, Hsinchu County (TW); Yu Zhu, Hsinchu County (TW)

(73) Assignees: JIANGSU ADVANCED MEMORY TECHNOLOGY CO., LTD., Jiangsu (CN); JIANGSU ADVANCED MEMORY SEMICONDUCTOR CO., LTD., Jiangsu (CN)

( * ) Notice: Subject to any disclaimer, the term of this patent is extended or adjusted under 35 U.S.C. 154(b) by 226 days.

(21) Appl. No.: 17/663,017

(22) Filed: May 11, 2022

(65) Prior Publication Data

US 2022/0278219 A1   Sep. 1, 2022

Related U.S. Application Data

(62) Division of application No. 16/993,245, filed on Aug. 13, 2020, now Pat. No. 11,362,192.

(30) Foreign Application Priority Data

Jun. 1, 2020   (CN) .......................... 202010484919.8

(51) Int. Cl.
*H01L 21/265* (2006.01)
*H01L 29/66* (2006.01)
(Continued)

(52) U.S. Cl.
CPC .... *H01L 29/6609* (2013.01); *H01L 21/26513* (2013.01); *H01L 29/8613* (2013.01); *H01L 29/868* (2013.01); *H10B 63/20* (2023.02); *H10N 70/063* (2023.02); *H01L 21/26586* (2013.01); *H01L 21/266* (2013.01)

(58) Field of Classification Search
CPC .......... H01L 29/6609; H01L 21/26513; H01L 27/2409; H01L 29/8613; H01L 29/868; H01L 45/1675; H01L 21/26586; H01L 21/266; H01L 29/8615; H01L 45/06; H01L 45/16; H10B 63/20; H10B 63/80
See application file for complete search history.

(56) References Cited

U.S. PATENT DOCUMENTS

2006/0289848 A1* 12/2006 Dennison ............. H10N 70/882
257/3

* cited by examiner

*Primary Examiner* — David Vu
(74) *Attorney, Agent, or Firm* — CKC & Partners Co., LLC

(57) ABSTRACT

A method of manufacturing a diode structure includes forming a first stack on a silicon layer on a substrate. A first sidewall spacer extending along and covering a sidewall of the first stack is formed. The silicon layer is selectively etched to a first predetermined depth, thereby forming a second stack. The remaining silicon layer includes a silicon base. A second sidewall spacer extending along and covering a sidewall of the second stack is formed. The silicon base is selectively etched to form a third stack on the substrate. With the second sidewall spacer as a mask, lateral plasma ion implantation is performed. Defects at the interface between two adjacent semiconductor layers can be reduced by the method.

9 Claims, 12 Drawing Sheets

(51) Int. Cl.
*H01L 29/861* (2006.01)
*H01L 29/868* (2006.01)
*H10B 63/00* (2023.01)
*H10N 70/00* (2023.01)
*H01L 21/266* (2006.01)

M100

```
┌─────────────────────────────────────────────────┐
│ forming a first stack on the silicon layer on the substrate, in
│ which the first stack, from bottom to top, sequentially includes
│ the first semiconductor layer, the top electrode layer, and the       ─── S102
│ phase change material layer
└─────────────────────────────────────────────────┘
                         │
┌─────────────────────────────────────────────────┐
│ forming a first sidewall spacer extending along and covering a
│ sidewall of the first stack, in which the top surface of the phase    ─── S104
│ change material layer is exposed
└─────────────────────────────────────────────────┘
                         │
┌─────────────────────────────────────────────────┐
│ using the first sidewall spacer and the phase change material
│ layer as a mask, selectively etching the silicon layer to a
│ predetermined depth, such that a second stack is formed, in           ─── S106
│ which the second stack includes a first silicon portion
│ protruding from a silicon base, and the first stack
└─────────────────────────────────────────────────┘
                         │
┌─────────────────────────────────────────────────┐
│ forming a second sidewall spacer extending along and covering
│ a sidewall of the second stack, in which the top surface of the       ─── S108
│ phase change material layer is exposed
└─────────────────────────────────────────────────┘
                         │
┌─────────────────────────────────────────────────┐
│ using the second sidewall spacer and the phase change material
│ layer as a mask, selectively etching the silicon base, such that a    ─── S110
│ third stack is formed on the substrate. In some embodiments,
│ the third stack includes a second silicon portion below the first
│ silicon portion, and the second stack
└─────────────────────────────────────────────────┘
                         │
┌─────────────────────────────────────────────────┐
│ using the second sidewall spacer as a mask, performing a lateral
│ plasma ion implantation, such that a doped region is formed in        ─── S112
│ the second silicon portion, in which a conductivity of the doped
│ region is different from a conductivity of the first
│ semiconductor layer
└─────────────────────────────────────────────────┘
```

```
┌─────────────────────────────────────────────────────────────┐
│ forming a first stack on the silicon layer on the substrate,│
│ in which the first stack, from bottom to top, sequentially  │──S202
│ includes the top electrode layer and the phase change       │
│ material layer                                              │
└─────────────────────────────────────────────────────────────┘
                              ↓
┌─────────────────────────────────────────────────────────────┐
│ using the phase change material layer as a mask, selectively│
│ etching the silicon layer to a first predetermined depth, in│──S204
│ which the remaining silicon layer includes a first silicon  │
│ base and a first silicon portion protruding from the first  │
│ silicon base                                                │
└─────────────────────────────────────────────────────────────┘
                              ↓
┌─────────────────────────────────────────────────────────────┐
│ performing an ion implantation to form a first doped region │──S206
│ in the first silicon portion                                │
└─────────────────────────────────────────────────────────────┘
                              ↓
┌─────────────────────────────────────────────────────────────┐
│ forming a first sidewall spacer extending along and covering│──S208
│ a sidewall of the first stack and a sidewall of the first   │
│ silicon portion                                             │
└─────────────────────────────────────────────────────────────┘
                              ↓
┌─────────────────────────────────────────────────────────────┐
│ using the first sidewall spacer and the phase change        │
│ material layer as a mask, selectively etching the first     │
│ silicon base to a second predetermined depth, such that a   │
│ second stack is formed, in which the remaining first silicon│──S210
│ base includes a second silicon base, and the second stack   │
│ includes a second silicon portion protruding from the       │
│ second silicon base, the first silicon portion, and the     │
│ first stack                                                 │
└─────────────────────────────────────────────────────────────┘
                              ↓
┌─────────────────────────────────────────────────────────────┐
│ forming a second sidewall spacer extending along and        │──S212
│ covering a sidewall of the second stack                     │
└─────────────────────────────────────────────────────────────┘
                              ↓
┌─────────────────────────────────────────────────────────────┐
│ using the second sidewall spacer and the phase change       │
│ material layer as a mask, selectively etching the second    │
│ silicon base, such that a third stack is formed on the      │──S214
│ substrate, in which the third stack includes a third silicon│
│ portion below the second silicon portion, and the second    │
│ stack                                                       │
└─────────────────────────────────────────────────────────────┘
                              ↓
┌─────────────────────────────────────────────────────────────┐
│ using the second sidewall spacer as a mask, performing a    │
│ lateral plasma ion implantation, such that a second doped   │
│ region is formed in the third silicon portion, in which a   │──S216
│ conductivity of the first doped region is different from a  │
│ conductivity of the second doped region                     │
└─────────────────────────────────────────────────────────────┘
```

Fig. 11

METHOD OF FABRICATING DIODE STRUCTURE

RELATED APPLICATIONS

This is a divisional application of the U.S. application Ser. No. 16/993,245 filed on Aug. 13, 2020, which claims priority to Chinese Application Serial Number 202010484919.8, filed Jun. 1, 2020, which is herein incorporated by reference.

BACKGROUND

Field of Invention

The present invention relates to a method of fabricating a diode structure. More particularly, the present invention relates to method of fabricating a diode structure using lateral plasma ion implantation.

Description of Related Art

Diodes are conventional semiconductor devices and are widely utilized in electronic applications such as power circuits or voltage converters. Generally, a diode includes a first semiconductor layer, a second semiconductor layer, and other layers between the first and second semiconductor layers. The first and second semiconductor layers are doped with III group elements or V group elements such as n-type or p-type dopants to have conductivities.

Generally, the n-type or p-type semiconductor layers are formed by a deposition process. However, interface, such as interfaces in a P-I-N junction (e.g. interfaces between the first semiconductor layer, an intrinsic silicon layer, and the second semiconductor layer), exists between different deposition layers, and formation of the interface may result in clustering of doped atoms (ions). Additionally, arrangement of atoms at the interface is irregular, and lots of defects such as vacancy, mismatch, bonding deformation are present at the interface. Such undesired defects would affect performance of the fabricated diode. On the other hand, to solve this problem using conventional fabrication process, the fabrication of the diode also becomes more complicated than before.

Therefore, there is a need to provide a method of fabricating a diode structure to reduce defects at the interface between two adjacent semiconductor layers.

SUMMARY

According to some embodiments of the invention, a method of fabricating a diode structure includes forming a first stack on a silicon layer of a substrate, wherein the first stack, from bottom to top, sequentially includes a first semiconductor layer, a top electrode layer, and a phase change material layer. A first sidewall spacer extending along and covering a sidewall of the first stack is formed, wherein a top surface of the phase change material layer is exposed. The silicon layer is selectively etched to a first determined depth by using the first sidewall spacer and the phase change material layer as a mask, such that a second stack is formed on a silicon base. The silicon base is a remaining part of the silicon layer after selectively etching the silicon layer. The second stack includes a first silicon portion protruding from the silicon base, and the first stack. A second sidewall spacer extending along and covering a sidewall of the second stack is formed, wherein the top surface of the phase change material layer is exposed. The silicon base is selectively etched by using the second sidewall spacer and the phase change material layer as a mask, such that a third stack is formed on the substrate. The third stack includes a second silicon portion below the first silicon portion, and the second stack. Then, a lateral plasma ion implantation is performed by using the second sidewall spacer as a mask, such that a doped region is formed in the second silicon portion. A conductivity of the doped region is different from a conductivity of the first semiconductor layer.

According to some other embodiments of the invention, a method of fabricating a diode structure includes forming a first stack on a silicon layer of a substrate. The first stack, from bottom to top, sequentially includes a top electrode layer and a phase change material layer. The silicon layer is selectively etched to a first determined depth by using the phase change material layer as a mask, wherein a remaining part of the silicon layer after selectively etching includes a first silicon base and a first silicon portion protruding from the first silicon base. An ion implantation is performed, such that a first doped region is formed in the first silicon portion. A first sidewall spacer extending along and covering sidewalls of the first stack and the first silicon portion is formed. The first silicon base is selectively etched by using the second sidewall spacer and the phase change material layer as a mask to a second predetermined depth, such that a second stack is formed on the substrate. A remaining part of the first silicon base includes a second silicon base, and the second stack includes a second silicon portion protruding from the second silicon base, the first silicon portion, and the first stack. A second sidewall spacer extending along and covering sidewalls of the second stack is formed. The second silicon base is selectively etched by using the second sidewall spacer and the phase change material layer as a mask, such that a third stack is formed on the substrate, wherein the third stack includes a third silicon portion below the second silicon portion, and the second stack. Then, a lateral plasma ion implantation is performed by using the second sidewall spacer as a mask, such that a second doped region is formed in the third silicon portion. A conductivity of the first doped region is different from a conductivity of the second doped region.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings, FIG. 1 is a flow chart of a method of fabricating a diode structure, according to some embodiments of the invention;

FIG. 11 is a flow chart of a method of fabricating a diode structure, according to some other embodiments of the invention.

DESCRIPTION OF THE EMBODIMENTS

Figure 3:
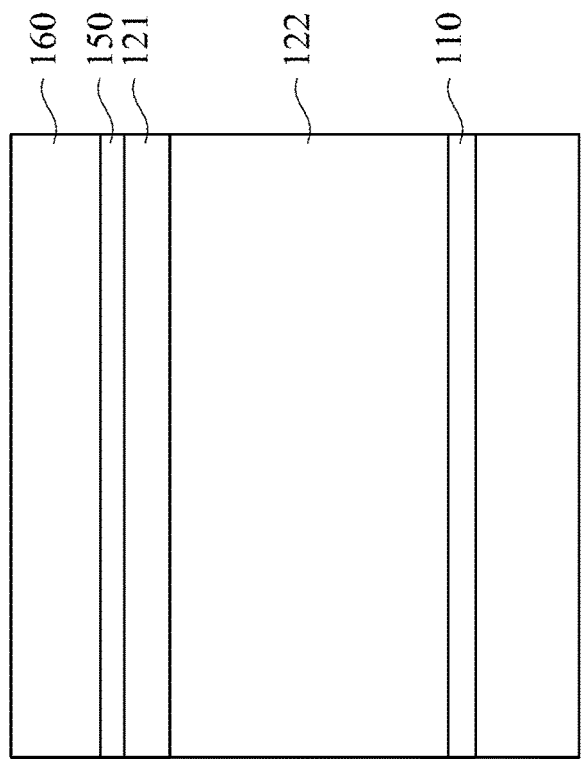
FIG. 2 to FIG. 10 are cross-sectional views of various stages of the method of fabricating the diode structure, according to some embodiments of the invention.

Reference will now be made in detail to the present embodiments of the invention, examples of which are illustrated in the accompanying drawings. Wherever possible, the same reference numbers are used in the drawings and the description to refer to the same or like parts.

As used herein, "around", "about", "substantially" or "approximately" shall generally mean within 20 percent, preferably within 10 percent, and more preferably within 5 percent of a given value or range. Numerical quantities given herein are approximate, meaning that the term "around", "about", "substantially" or "approximately" can be inferred if not expressly stated.

This invention discloses a diode structure, in which the p-type or n-type semiconductor layer is formed by a lateral plasma ion implantation, such that the defects between adjacent semiconductor layers of the diode structure can be prevented.

FIG. 1 is a flow chart of a method M100 of fabricating a diode structure, according to some embodiments of the invention. As illustrated in FIG. 1, the method M100 includes an operation S102, an operation S104, an operation S106, an operation S108, an operation S110, and an operation S112.

FIG. 2 to FIG. 10 are cross-sectional views of various stages of the method M100 of fabricating the diode structure, according to some embodiments of the invention.

Figure 2:
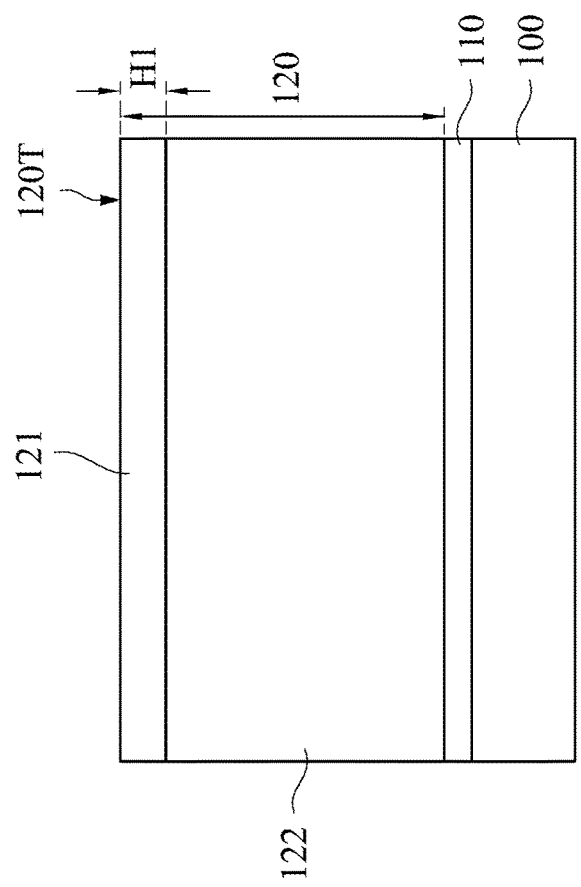

Referring to FIG. 2, a substrate 100 is provided. In some embodiments, the substrate 100 can be a silicon substrate, a silicon-containing substrate, a III-V group on silicon substrate (e.g. GaN-on-silicon substrate), or other semiconductor substrate.

As shown in FIG. 2, an initial silicon layer 120 is formed on the substrate 100. Then, an ion implantation is performed to a top surface 120T of the initial silicon layer 120, such that a first semiconductor layer 121 is formed from the top surface 120T of the initial silicon layer 120 into a depth H1, in which the remaining initial silicon layer 120 is regarded as a silicon layer 122.

In some embodiments, the initial silicon layer 120 is an intrinsic silicon layer and is formed by a deposition process, such as a CVD, a PECVD, a LPCVD, or a PVD, but this invention is not limited to.

In some embodiments, the first semiconductor layer 121 is a p-type semiconductor layer. In some embodiments, the first semiconductor layer 121 has a doping concentration ranging from $10^{16}$ atom/cm$^2$ to $10^{20}$ atom/cm$^2$. Preferably, the first semiconductor layer 121 has a doping concentration ranging from $10^{19}$ atom/cm$^2$ to $10^{20}$ atom/cm$^2$.

In some embodiments, prior to forming the initial silicon layer 120 on the substrate 100, a bottom electrode 110 is firstly formed on the substrate 100, such that the bottom electrode 110 is disposed between the substrate 100 and the silicon layer 122, as shown in FIG. 2. In some embodiments, the bottom electrode 110 is formed by deposition. The material of the bottom electrode 110 includes Au, Cr, Ni, Pt, Ti, Al, Rh, combinations thereof, or other suitable metals having excellent conductivity.

Referring to FIG. 3, a top electrode layer 150 is formed on the first semiconductor layer 121. In some embodiments, the top electrode layer 150 is deposited on the first semiconductor layer 121. The material of the top electrode layer 150 includes Au, Cr, Ni, Pt, Ti, Al, Rh, combinations thereof, or other suitable metals having excellent conductivity.

As shown in FIG. 3, a phase change material layer 160 is formed on the top electrode layer 150. In some embodiments, the phase change material layer 160 is formed by any suitable deposition process, such as CVD, PVD, ALD, or the likes.

In some embodiments, the phase change material layer 160 is a single layer or a multilayer that includes a phase change material. The phase change material includes GST material, such as $Ge_2Sb_2Te_5$, $Ge_1Sb_2Te_4$, $Ge_1Sb_4Te_7$, combinations thereof, or similar material. Other possible phase change material can be GeTe, $Sb_2Te_3$, GaSb, InSb, Al—Te, Te—Sn—Se, Ge—Sb—Te, In—Sb—Te, Ge—Se—Ga, Bi—Se—Sb, Ga—Se—Te, Sn—Sb—Te, In—Sb—Ge, Te—Ge—Sb—S, Te—Ge—Sn—O, Sb—Te—Bi—Se, Te—Ge—Sn—Au, Pd—Te—Ge—Sn, In—Se—Ti—Co, Ge—Sb—Te—Pd, Ag—In—Sb—Te, Ge—Te—Sn—Pt, Ge—Te—Sn—Ni, Ge—Te—Sn—Pd, and Ge—Sb—Se—Te.

Figure 4:
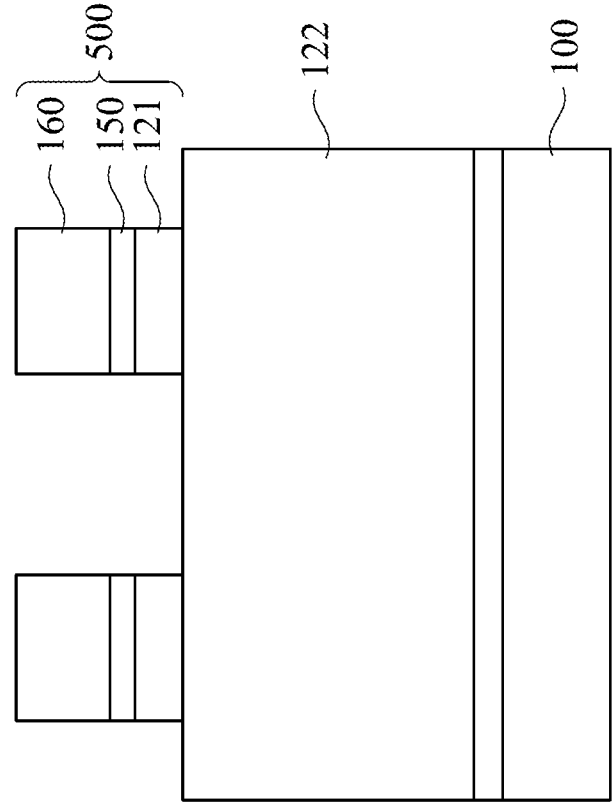

Referring to operation S102 and FIG. 4, a first stack 500 is formed on the silicon layer 122 on the substrate 100. The first stack 500, from bottom to top, sequentially includes the first semiconductor layer 121, the top electrode layer 150, and the phase change material layer 160. More particularly, patterning processes such as one or more lithography and etching processes are performed to pattern the first semiconductor layer 121, the top electrode layer 150, and the phase change material layer 160 into the first stack 500.

Figure 5:
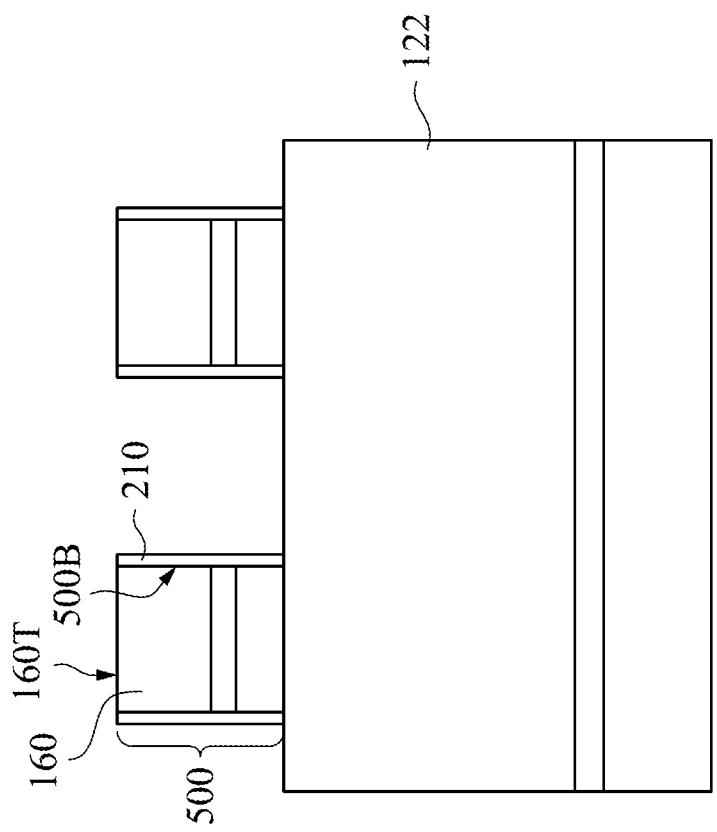

Referring to operation S104 and FIG. 5, a first sidewall spacer 210 extending along and covering a sidewall 500B of the first stack 500 is formed. In some embodiments, the first sidewall spacer 210 has a D-shape or I-shape in cross-section, and the first sidewall spacer 210 serves as an anti-etching material during the following step of etching the silicon layer 122.

In some embodiments, the first sidewall spacer 210 is formed by ALD process.

In some embodiments, the first sidewall spacer 210 has a thickness ranging from 1 nm to 5 nm. Preferably, the thickness of the first sidewall spacer 210 ranges from 1 nm to 3 nm, such as 1.0 nm, 1.2 nm, 1.4 nm, 1.6, nm, 1.8 nm, 2.0 nm, 2.2 nm, 2.4 nm, 2.6 nm, 2.8 nm, or 3.0 nm.

In some embodiments, the first sidewall spacer 210 is made of a dielectric material, such as $SiO_2$, SiN, SiON, or other suitable materials.

Figure 6:
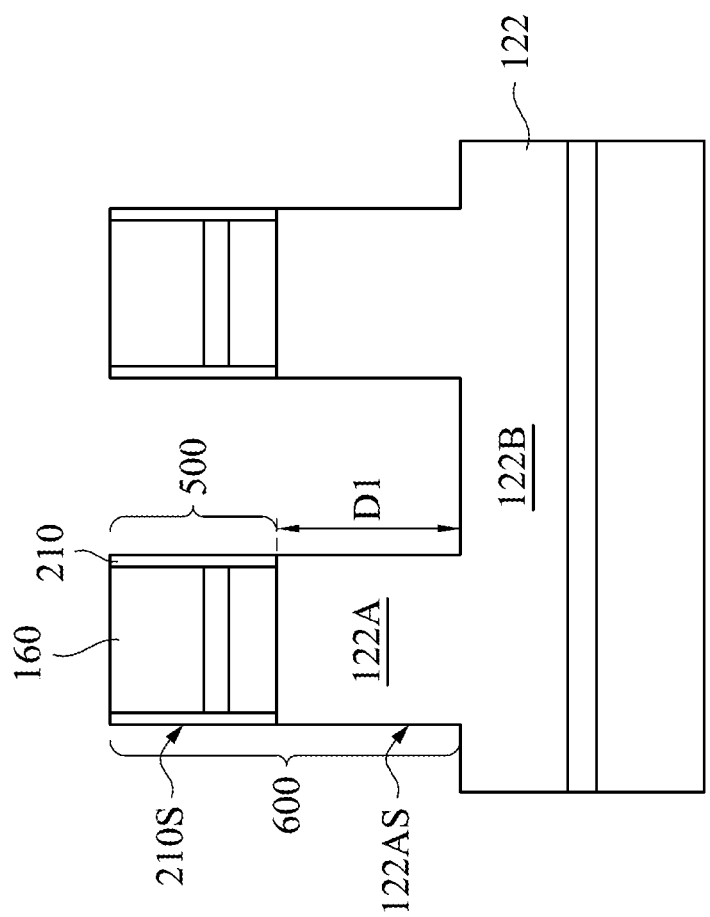

Referring to operation S106 and FIG. 6, using the first sidewall spacer 210 and the phase change material layer 160 as a mask, the silicon layer 122 is selectively etched to a predetermined depth D1, such that a second stack 600 is formed.

As shown in FIG. 6, the remaining silicon layer 122 includes a silicon base 122B. The second stack 600 includes a first silicon portion 122A protruding from the silicon base 122B, and the first stack 500.

In some embodiments, a side surface 122AS of the first silicon portion 122A vertically aligns with a side surface 210S of the first sidewall spacer 210.

Figure 7:
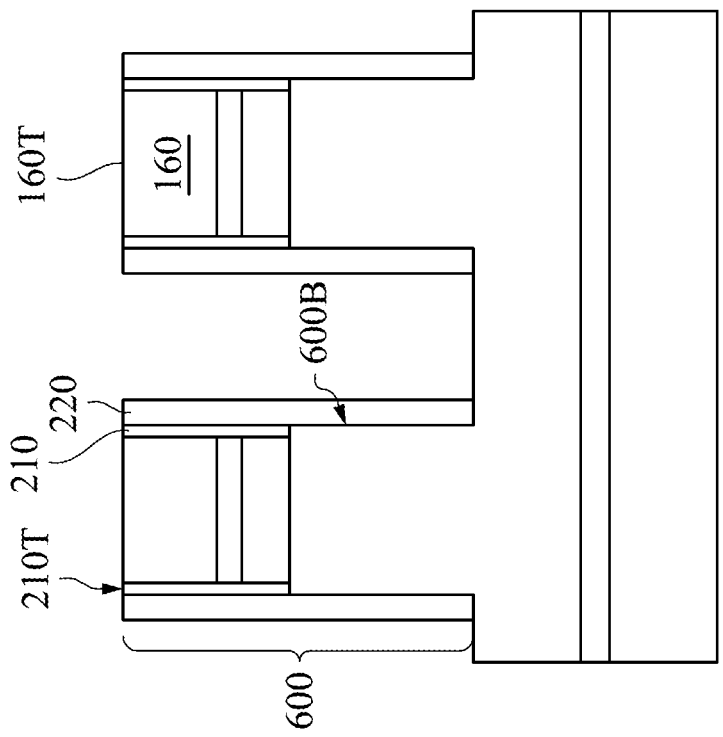

Referring to operation S108 and FIG. 7, a second sidewall spacer 220 extending along and covering a sidewall 600B of the second stack 600 is formed. In some embodiments, a top surface 160T of the phase change material layer 160 is exposed. In some embodiments, a top surface 210T of first sidewall spacer 210 is exposed.

In some embodiments, the second sidewall spacer 220 has a thickness ranging from 1 nm to 5 nm. Preferably, the thickness of the second sidewall spacer 220 ranges from 1 nm to 3 nm, such as 1.0 nm, 1.2 nm, 1.4 nm, 1.6, nm, 1.8 nm, 2.0 nm, 2.2 nm, 2.4 nm, 2.6 nm, 2.8 nm, or 3.0 nm.

In some embodiments, the second sidewall spacer 220 is made of a dielectric material, such as $SiO_2$, SiN, SiON, or other suitable materials. In some embodiments, the first sidewall spacer 210 and the second sidewall spacer 220 are made of the same material.

In some embodiments, the second sidewall spacer 220 is formed by ALD process.

Figure 8:
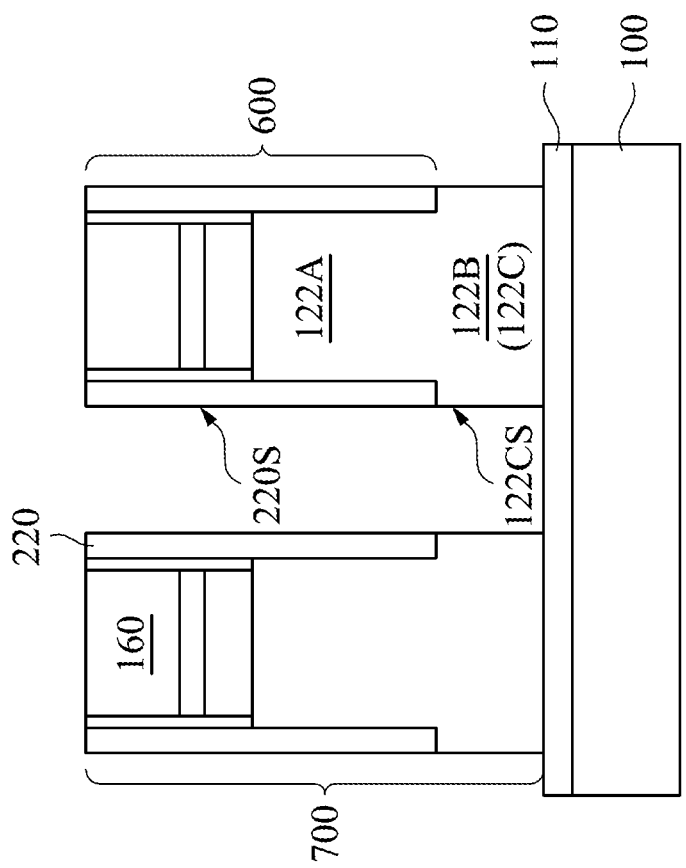

Referring to operation S110 and FIG. 8, using the second sidewall spacer 220 and the phase change material layer 160 as a mask, the silicon base 122B is selectively etched, such that a third stack 700 is formed on the substrate 100. In some embodiments, the third stack 700 includes a second silicon portion 122C below the first silicon portion 122A, and the second stack 600. In some embodiments, the silicon base 122B is selectively etched, and the etching process stops at the bottom electrode 110.

In some embodiments, a side surface 122CS of the second silicon portion 122C vertically aligns with a side surface 220S of the second sidewall spacer 220.

Figure 9:
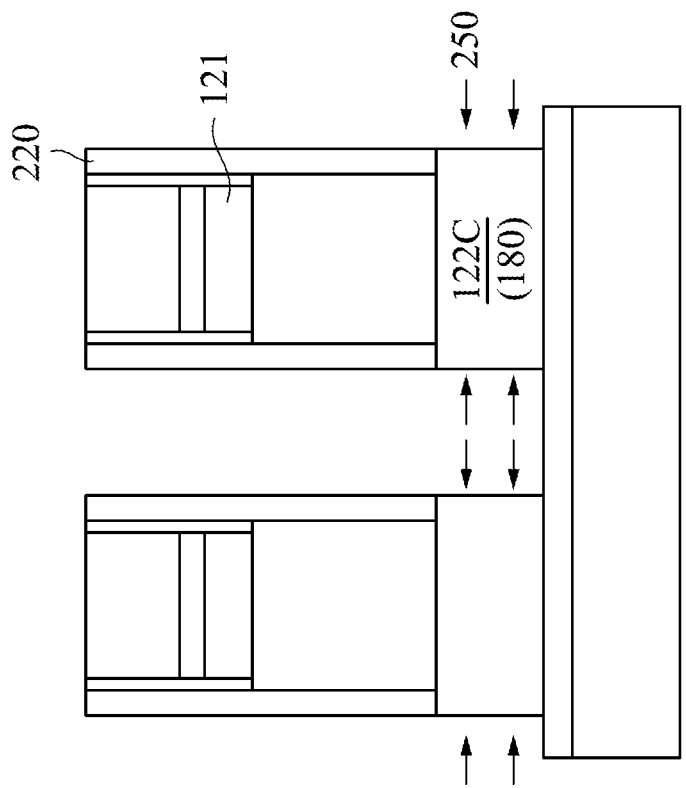

Referring to operation S112 and FIG. 9, using the second sidewall spacer 220 as a mask, a lateral plasma ion implantation 250 is performed, such that a doped region 180 is formed in the second silicon portion 122C. For example, the lateral plasma ion implantation 250 is performed by using Varian Plasma Doping (PLAD™), provided by Applied Materials, Inc.

In some embodiments, as shown in FIG. 9, a conductivity of the doped region 180 is different from a conductivity of the first semiconductor layer 121. For example, the doped region 180 includes n-type semiconductor layer, and the first semiconductor layer 121 includes p-type semiconductor layer. In some other embodiments, the doped region 180 includes p-type semiconductor layer, and the first semiconductor layer 121 includes n-type semiconductor layer. The conductivity of the doped region 180 is opposite to the conductivity of the first semiconductor layer 121 to form a diode.

In some embodiments, the doped region 180 has a doping concentration ranging from $10^{16}$ atom/$cm^2$ to $10^{20}$ atom/$cm^2$. Preferably, the doped region 180 has a doping concentration ranging from $10^{19}$ atom/$cm^2$ to $10^{20}$ atom/$cm^2$.

Figure 10:
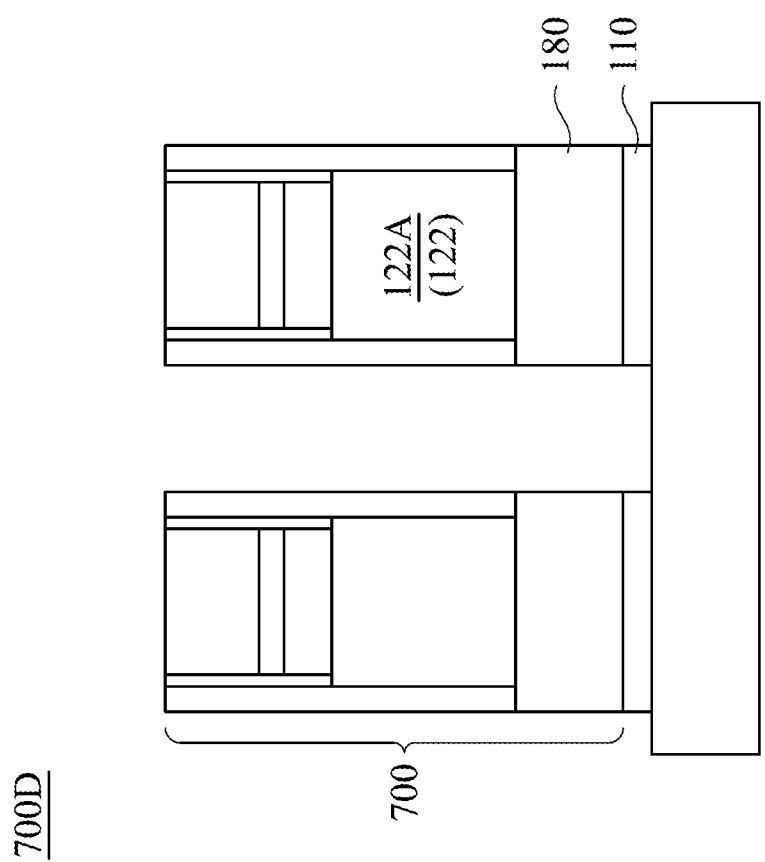

Referring to FIG. 10, after the lateral plasma ion implantation 250 is performed, the portion of the bottom electrode 110 uncovered by the third stack 700 is removed.

As shown in FIG. 10, according to some embodiments of the invention, a diode structure 700D is provided. The doped region 180 of the diode structure 700D is formed by the lateral plasma ion implantation. It is noted that both the doped region 180 and the first silicon portion 122A are formed from the silicon layer 122. In other words, the boundary between the doped region 180 and the first silicon portion 122A is continuous, and the doped region 180 and the first silicon portion 122A are not formed by depositing individual layers. Therefore, the interface between the doped region 180 and the first silicon portion 122A can be prevented, such that the issues raised by the interface can be reduced.

FIG. 11 is a flow chart of a method M200 of fabricating a diode structure, according to some embodiments of the invention. As illustrated in FIG. 11, the method M200 includes an operation S202, an operation S204, an operation S206, an operation S208, an operation S210, an operation S212, an operation S214, and an operation S216.

FIG. 12 to FIG. 20 are cross-sectional views of various stages of the method M200 of fabricating the diode structure, according to some embodiments of the invention.

Figure 12:
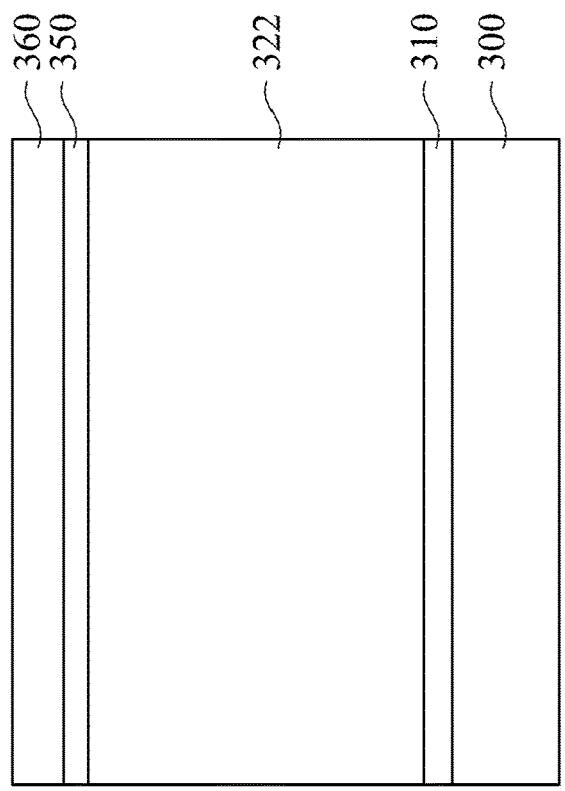

Referring to FIG. 12, similar to FIG. 3, a substrate 300 is provided. Then, a bottom electrode 310 is formed on the substrate 300, a silicon layer 322 is formed on the bottom electrode 310, a top electrode layer 350 is formed on the silicon layer 322, and a phase change material layer 360 is formed on the top electrode layer 350.

In some embodiments, the phase change material layer 160 is a single layer or a multilayer that includes a phase change material. The phase change material includes GST material, such as $Ge_2Sb_2Te_5$, $Ge_1Sb_2Te_4$, $Ge_1Sb_4Te_7$, combinations thereof, or similar material. Other possible phase change material can be GeTe, $Sb_2Te_3$, GaSb, InSb, Al—Te, Te—Sn—Se, Ge—Sb—Te, In—Sb—Te, Ge—Se—Ga, Bi—Se—Sb, Ga—Se—Te, Sn—Sb—Te, In—Sb—Ge, Te—Ge—Sb—S, Te—Ge—Sn—O, Sb—Te—Bi—Se, Te—Ge—Sn—Au, Pd—Te—Ge—Sn, In—Se—Ti—Co, Ge—Sb—Te—Pd, Ag—In—Sb—Te, Ge—Te—Sn—Pt, Ge—Te—Sn—Ni, Ge—Te—Sn—Pd, and Ge—Sb—Se—Te.

Figure 13:
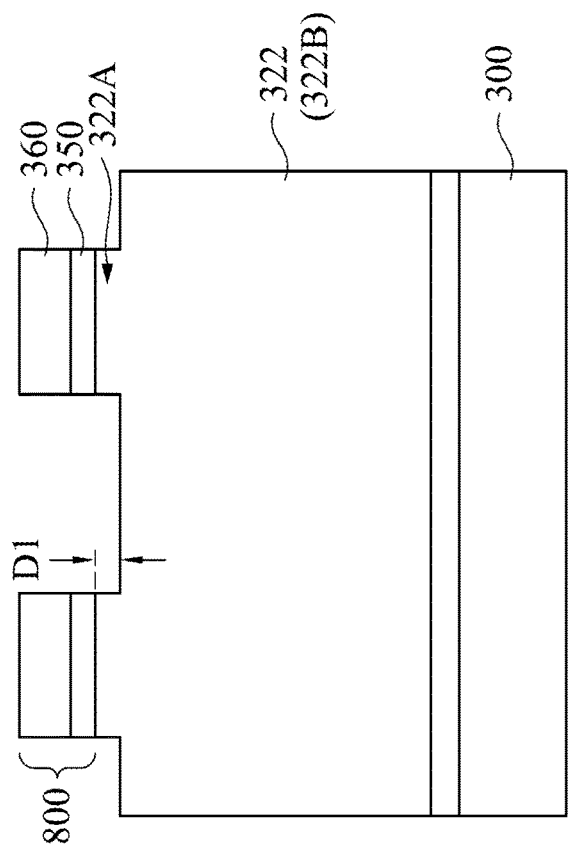
FIG. 12 to FIG. 20 are cross-sectional views of various stages of the method of fabricating the diode structure, according to some other embodiments of the invention.

Referring to operation S202 and FIG. 13, a first stack 800 is formed on the silicon layer 322 on the substrate 300. The first stack 800, from bottom to top, sequentially includes the top electrode layer 350 and the phase change material layer 360. More particularly, patterning processes such as one or more lithography and etching processes are performed to pattern the top electrode layer 350 and the phase change material layer 360 into the first stack 800.

Referring to operation S204 and FIG. 13, after the first stack 800 is formed, using the phase change material layer 360 as a mask, the silicon layer 322 is selectively etched to a first predetermined depth D1. In some embodiments, the remaining silicon layer 322 includes a first silicon base 322B and a first silicon portion 322A protruding from the first silicon base 322B.

Figure 14:
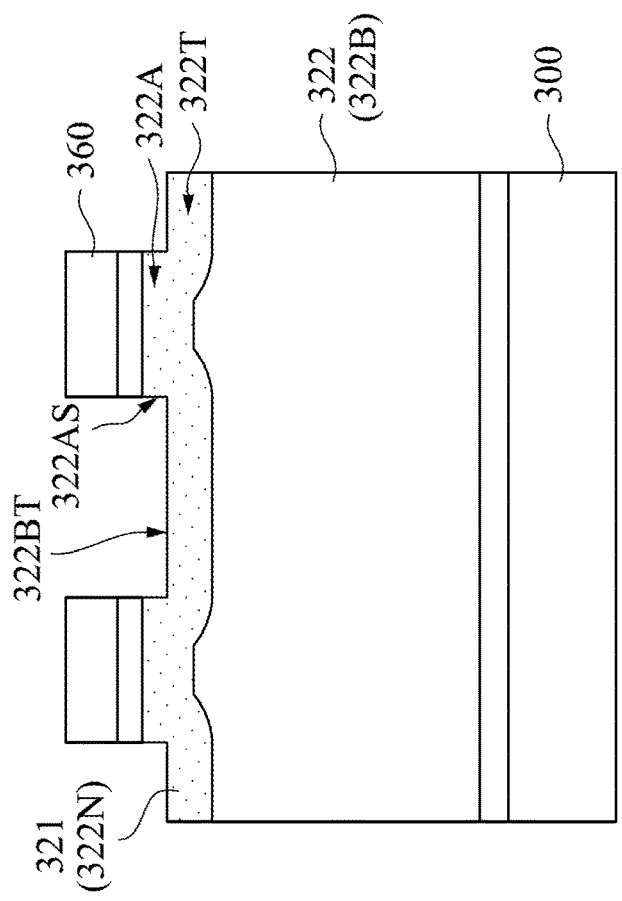

Referring to operation S206 and FIG. 14, an ion implantation is performed to form a first doped region 321 in the first silicon portion 322A. In some embodiments, the phase change material layer 360 serves as a mask, and the ion implantation is performed in a direction perpendicular to a top surface 322BT of the first silicon base 322B to dope a top portion 322T of the first silicon base 322B. The ion implantation is also performed to a sidewall 322AS of the first silicon portion 322A to dope the first silicon portion 322A. As a result, a first doped region 321 is formed along a top portion 322A of the remaining silicon layer 322.

In some embodiments, the first doped region 321 has a doping concentration ranging from $10^{16}$ atom/$cm^2$ to $10^{20}$ atom/$cm^2$. Preferably, the doped region 180 has a doping concentration ranging from $10^{19}$ atom/$cm^2$ to $10^{20}$ atom/$cm^2$.

Figure 15:
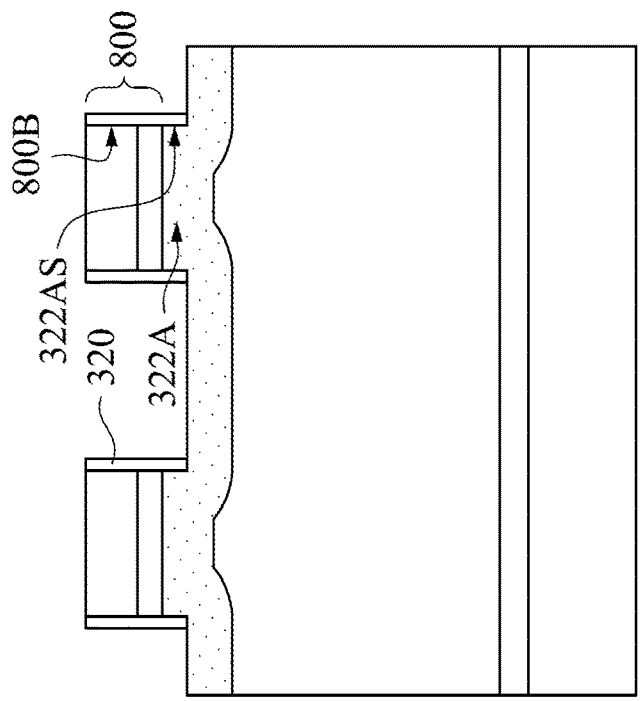

Referring to operation S208 and FIG. 15, a first sidewall spacer 320 extending along and covering a sidewall 800B of the first stack 800 and a sidewall 322AS of the first silicon portion 322A is formed.

In some embodiments, the first sidewall spacer 320 has a thickness ranging from 1 nm to 5 nm. Preferably, the thickness of the first sidewall spacer 320 ranges from 1 nm to 3 nm, such as 1.0 nm, 1.2 nm, 1.4 nm, 1.6, nm, 1.8 nm, 2.0 nm, 2.2 nm, 2.4 nm, 2.6 nm, 2.8 nm, or 3.0 nm.

Figure 16:
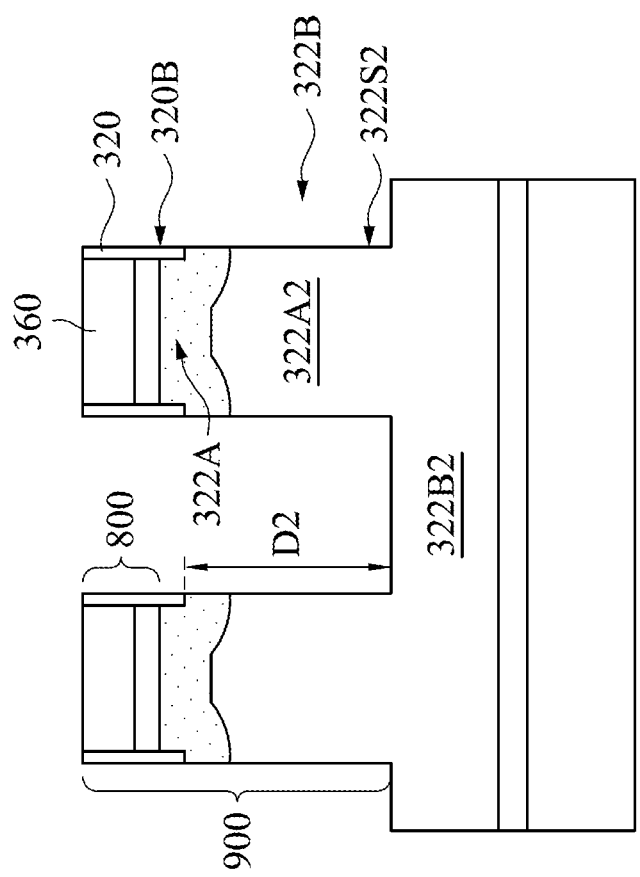

Referring to operation S210 and FIG. 16, using the first sidewall spacer 320 and the phase change material layer 360 as a mask, the first silicon base 322B is selectively etched to a second predetermined depth D2, such that a second stack 900 is formed. In some embodiments, the remaining first silicon base 322B includes a second silicon base 322B2. The second stack 900 includes a second silicon portion 322A2 protruding from the second silicon base 322B2, the first silicon portion 322A, and the first stack 800.

In some embodiments, a side surface 322S2 of the second silicon portion 322A2 vertically aligns with a side surface 320B of the first sidewall spacer 320.

Figure 17:
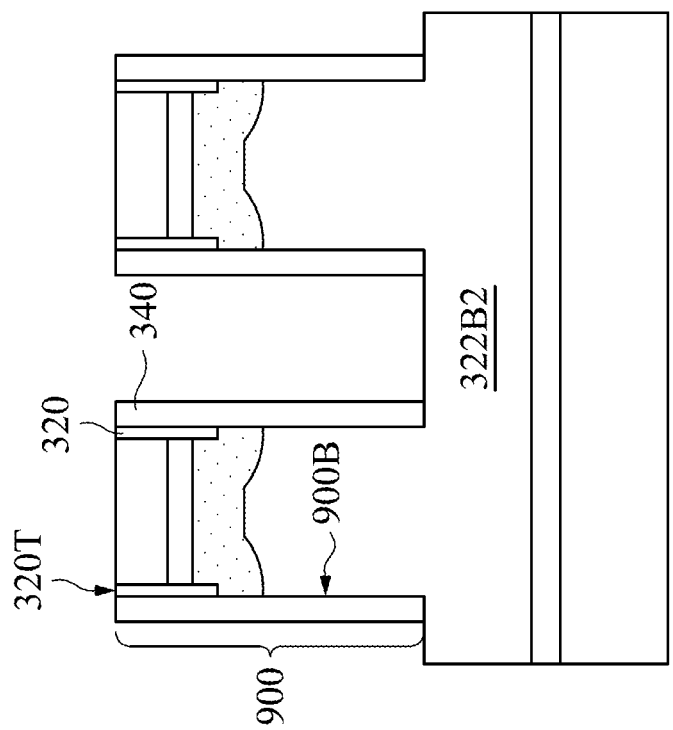

Referring to operation S212 and FIG. 17, a second sidewall spacer 340 extending along and covering a sidewall 900B of the second stack 900 is formed. In some embodiments, a top surface 320T of first sidewall spacer 320 is exposed.

In some embodiments, the second sidewall spacer 340 has a thickness ranging from 1 nm to 5 nm. Preferably, the thickness of the second sidewall spacer 340 ranges from 1 nm to 3 nm, such as 1.0 nm, 1.2 nm, 1.4 nm, 1.6, nm, 1.8 nm, 2.0 nm, 2.2 nm, 2.4 nm, 2.6 nm, 2.8 nm, or 3.0 nm.

Figure 18:
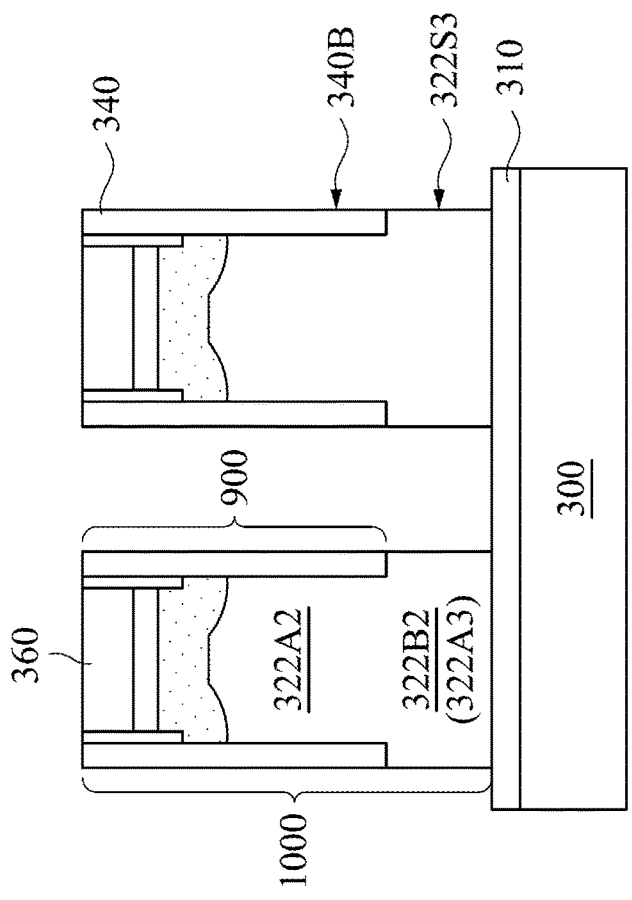

Referring to operation S214 and FIG. 18, using the second sidewall spacer 340 and the phase change material layer 360 as a mask, the second silicon base 32262 is selectively etched, such that a third stack 1000 is formed on the substrate 300. In some embodiments, the third stack 1000 includes a third silicon portion 322A3 below the second silicon portion 322A2, and the second stack 900. In some embodiments, the second silicon base 322B2 is selectively etched, and the etching process stops at the bottom electrode 310.

In some embodiments, a side surface 322S3 of the third silicon portion 322A3 vertically aligns with a side surface 340S of the second sidewall spacer 340.

Figure 19:
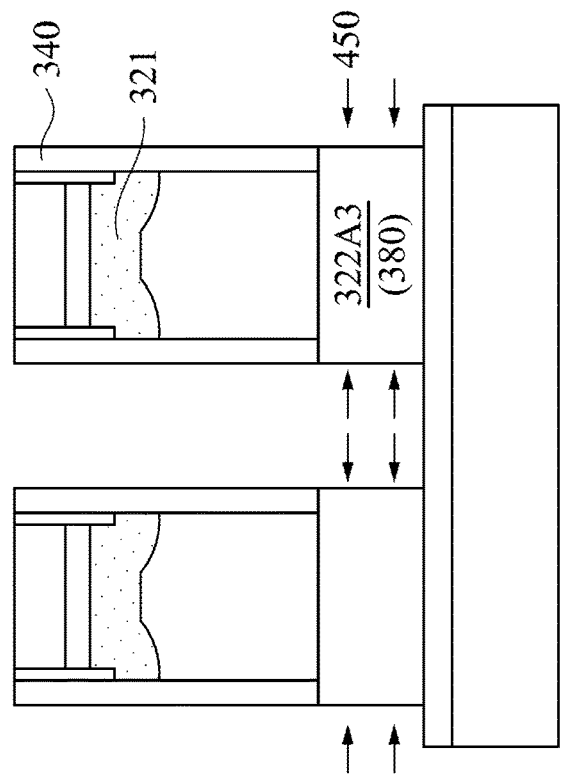

Referring to operation S216 and FIG. 19, using the second sidewall spacer 340 as a mask, a lateral plasma ion implantation 450 is performed, such that a second doped region 380 is formed in the third silicon portion 322A3.

In some embodiments, the second doped region 380 has a doping concentration ranging from $10^{16}$ atom/cm$^2$ to $10^{20}$ atom/cm$^2$. Preferably, the second doped region 380 has a doping concentration ranging from $10^{19}$ atom/cm$^2$ to $10^{20}$ atom/cm$^2$.

As shown in FIG. 19, a conductivity of the first doped region 321 is different from a conductivity of the second doped region 380. For example, the first doped region 321 includes n-type semiconductor layer, and the second doped region 380 includes p-type semiconductor layer. In some other embodiments, the first doped region 321 includes p-type semiconductor layer, and the second doped region 380 includes n-type semiconductor layer. The conductivity of the first doped region 321 is opposite to the conductivity of the second doped region 380 to form a diode.

Figure 20:
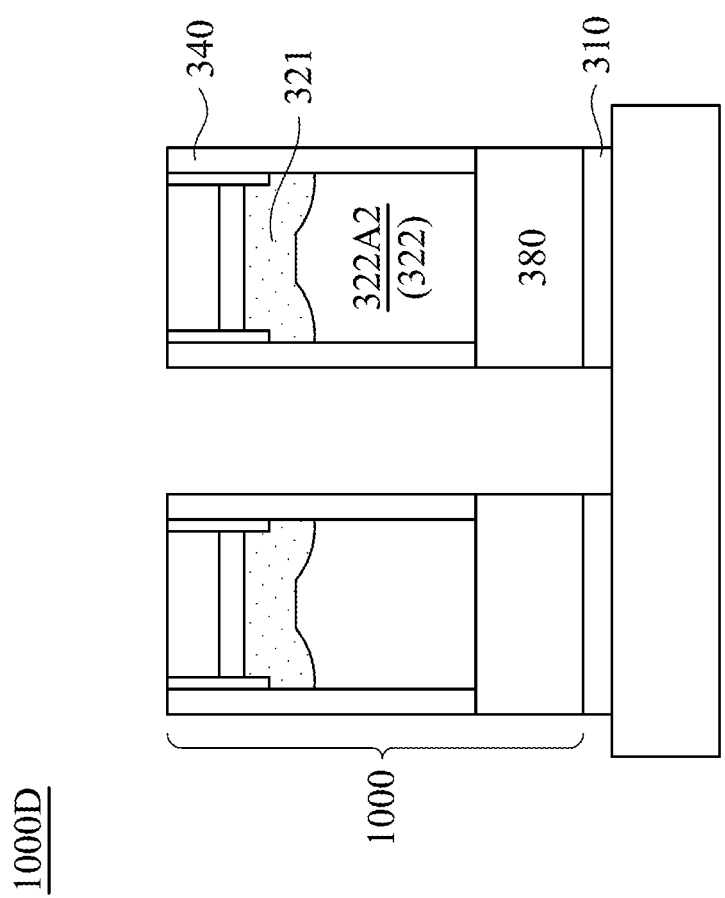

Referring to FIG. 20, after the lateral plasma ion implantation 450 is performed, the portion of the bottom electrode 310 uncovered by the third stack 1000 is removed.

As shown in FIG. 20, according to some embodiments of the invention, a diode structure 1000D is provided. The second doped region 380 of the diode structure 1000D is formed by the lateral plasma ion implantation. It is noted that both the second doped region 380 and the second silicon portion 322A2 are formed from the silicon layer 322. On the other hand, the boundary between the second doped region 380 and the second silicon portion 322A2 is continuous, and the second doped region 380 and the second silicon portion 322A2 are not formed by depositing individual layers. Therefore, the interface between the second doped region 380 and the second silicon portion 322A2 can be prevented, such that the issues raised by the interface can be reduced.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a diode structure, comprising:
   forming a first stack on a silicon layer of a substrate, wherein the first stack, from bottom to top, sequentially comprises a top electrode layer and a phase change material layer;
   selectively etching the silicon layer to a first determined depth by using the phase change material layer as a mask, wherein a remaining part of the silicon layer after selectively etching comprises a first silicon base and a first silicon portion protruding from the first silicon base;
   performing an ion implantation, such that a first doped region is formed in the first silicon portion;
   forming a first sidewall spacer extending along and covering sidewalls of the first stack and the first silicon portion;
   selectively etching the first silicon base by using the first sidewall spacer and the phase change material layer as a mask to a second predetermined depth, such that a second stack is formed on the substrate, wherein a remaining part of the first silicon base comprises a second silicon base, and the second stack comprises a second silicon portion protruding from the second silicon base, the first silicon portion, and the first stack;
   forming a second sidewall spacer extending along and covering sidewalls of the second stack;
   selectively etching the second silicon base by using the second sidewall spacer and the phase change material layer as a mask, such that a third stack is formed on the substrate, wherein the third stack comprises a third silicon portion below the second silicon portion, and the second stack; and
   performing a lateral plasma ion implantation by using the second sidewall spacer as a mask, such that a second doped region is formed in the third silicon portion, wherein a conductivity of the first doped region is different from a conductivity of the second doped region.

2. The method of claim 1, wherein a side surface of the second silicon portion vertically aligns with a side surface of the first sidewall spacer.

3. The method of claim 1, wherein a side surface of the third silicon portion vertically aligns with a side surface of the second sidewall spacer.

4. The method of claim 1, further comprising:
   prior to forming the first stack, forming a bottom electrode on the substrate, such that the bottom electrode is disposed between the substrate and the silicon layer.

5. The method of claim 4, further comprising:
   removing a portion of the bottom electrode that is uncovered by the third stack, after performing the lateral plasma ion implantation.

6. The method of claim 1, wherein a top surface of the first sidewall spacer is exposed.

7. The method of claim 1, wherein the phase change material layer comprises a single layer or a multilayer that includes a phase change material.

8. The method of claim 1, wherein a doping concentration of the first doped region ranges from $10^{16}$ atom/cm$^2$ to $10^{20}$ atom/cm$^2$.

9. The method of claim 1, wherein a doping concentration of the second doped region ranges from $10^{16}$ atom/cm$^2$ to $10^{20}$ atom/cm$^2$.

* * * * *